United States Patent
Fifield et al.

(10) Patent No.: US 6,438,051 B1
(45) Date of Patent: Aug. 20, 2002

(54) STABILIZED DIRECT SENSING MEMORY ARCHITECTURE

(75) Inventors: John A. Fifield, Underhill, VT (US); Wing K. Luk, Chappaqua; Daniel W. Storaska, Wappingers Falls, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/870,559

(22) Filed: May 31, 2001

(51) Int. Cl.[7] .................................................. G11C 7/04
(52) U.S. Cl. .......................... 365/207; 365/211; 327/51
(58) Field of Search ................................. 365/207, 205, 365/210, 211; 327/51, 53, 57

(56) References Cited

U.S. PATENT DOCUMENTS

| | | | |
|---|---|---|---|
| 5,013,943 A | * 5/1991 | Hirose | 327/51 |
| 5,272,674 A | * 12/1993 | Pathak et al. | 365/207 |
| 5,289,412 A | * 2/1994 | Frary et al. | 365/210 |
| 5,790,467 A | 8/1998 | Haukness et al. | 365/205 |
| 5,831,919 A | 11/1998 | Haukness et al. | 365/205 |
| 6,026,034 A | 2/2000 | Suzuki et al. | 365/190 |
| 6,128,238 A | 10/2000 | Nagai et al. | 365/207 |
| 6,288,575 B1 | * 9/2001 | Forbes | 327/57 |
| 6,297,670 B1 | * 10/2001 | Chao et al. | 327/51 |
| 6,370,072 B1 | * 4/2002 | Dennard et al. | 365/210 |

* cited by examiner

Primary Examiner—Tan T. Nguyen
(74) Attorney, Agent, or Firm—Scully, Scott, Murphy & Presser; Robert A. Walsh, Esq.

(57) ABSTRACT

A stabilized direct sensing memory architecture which provides Process, Voltage and Temperature (PVT) compensation in a memory array to a direct sense circuit to increase the manufacturing yield thereof, and to extend the operating voltage and temperature ranges thereof independent of manufacturing tolerances. A single-ended sense amplifier structure has a common source NFET amplifier with an adjustable current source load provided by a PFET. The PFET current source is automatically adjusted to place the NFET amplifier in an operating range to provide maximum amplification of a small signal superimposed on a bitline precharge voltage. A mimic bias generator circuit provides this operating point adjustment, and realizes a direct, single-ended sensing operation using a small number of transistors.

34 Claims, 3 Drawing Sheets

V_x GENERATOR

Vblref IS HALFWAY BETWEEN '1' AND '0' BITLINE LEVELS

STABILIZED DIRECT SENSING MEMORY ARCHITECTURE

BACKGROUND OF THE INVENTION

1. Field of the Invention

The present invention relates generally to a stabilized direct sensing memory architecture, and more particularly pertains to a stabilized direct sense memory amplifier which comprises a common source NFET amplifier with an adjustable current source load provided by a PFET. The PFET current source is automatically adjusted to place the NFET amplifier in an operating range to provide maximum amplification of a small signal superimposed on a bitline precharge voltage. A mimic bias generator circuit provides this operating point adjustment, and realizes a direct, single-ended sensing operation using a small number of transistors.

The present invention also has general applicability to sense data firm a transmission line or from any type of memory cell and in general to any application where a small analog signal level needs to be converted to a full digital signal, such as in optical interface transmission systems.

2. Discussion of the Prior Art

Direct sensing schemes have advantages of density, stability against read disturbs from heavy datalines, elimination of capacitive line-to-line coupling and associated data pattern sensitivities, and other noise advantages. Direct sensing schemes rely on switching a static latch, or an inverter, or a simple FET device, in response to a transition between a '1' bitline voltage and a '0' bitline voltage. In a typical prior art inverter having a power supply voltage of 1.2 volts, the inverter will switch from a logical high to a logical low level with a change of about 200 mv to its gate voltage. Variations in the manufacturing processes can cause different cases ranging from nominal to extreme imbalances between an NFET beta and a PFET beta. The change in gate voltage (200 mv) needed to switch between an output high and low is somewhat independent of process and temperature variations, but the absolute DC voltage switch point can move several hundred millivolts over different process and temperature ranges. Switching an inverter with a range of switch points with a small bitline signal would require tight manufacturing tolerances and may have a limited process window.

Another limitation of the prior art is its voltage sensitivity as the power supply is lowered. As the power supply is lowered, the ability of the output inverter to output a correct logical '1' level degrades, with the OUT signal slowing down and eventually failing as Vdd is reduced from 1.2V to 0.9V, with typical bitline voltage levels of about 50 mV around a precharge voltage level. This sensitivity limits the operating voltage of a direct sensing scheme and results in reduced product quality level, reliability and operating ranges.

Temperature has a more severe effect on the ability of an inverter to sense a small input signal. If the bitline voltage is lowered from 1.2 volts to 1.1 volts to simulate a worst case '1' level, at low temperatures the difference between a '1' and '0' inverter input level is greatly reduced. This causes the output node to falsely output high levels for '0' data input at low temperatures. This is caused by drifting of the NFET's Vt and beta relative to that of the PFET's, and results in limited operating and temperature ranges.

SUMMARY OF THE INVENTION

Accordingly, it is a object of the present invention to provide a stabilized direct sensing memory architecture which provides Process, Voltage and Temperature (PVT) compensation to a direct sensing circuit to increase manufacturing yield, and to extend the operating voltage and temperature ranges thereof independently of manufacturing tolerances.

BRIEF DESCRIPTION OF THE DRAWINGS

The foregoing objects and advantages of the present invention for a stabilized direct sensing memory architecture may be more readily understood by one skilled in the art with reference being had to the following detailed description of several preferred embodiments thereof taken in conjunction with the accompanying drawings wherein like elements are designated by identical reference numerals throughout the several views, and in which.

DETAILED DESCRIPTION OF THE DRAWINGS

Figure 1:
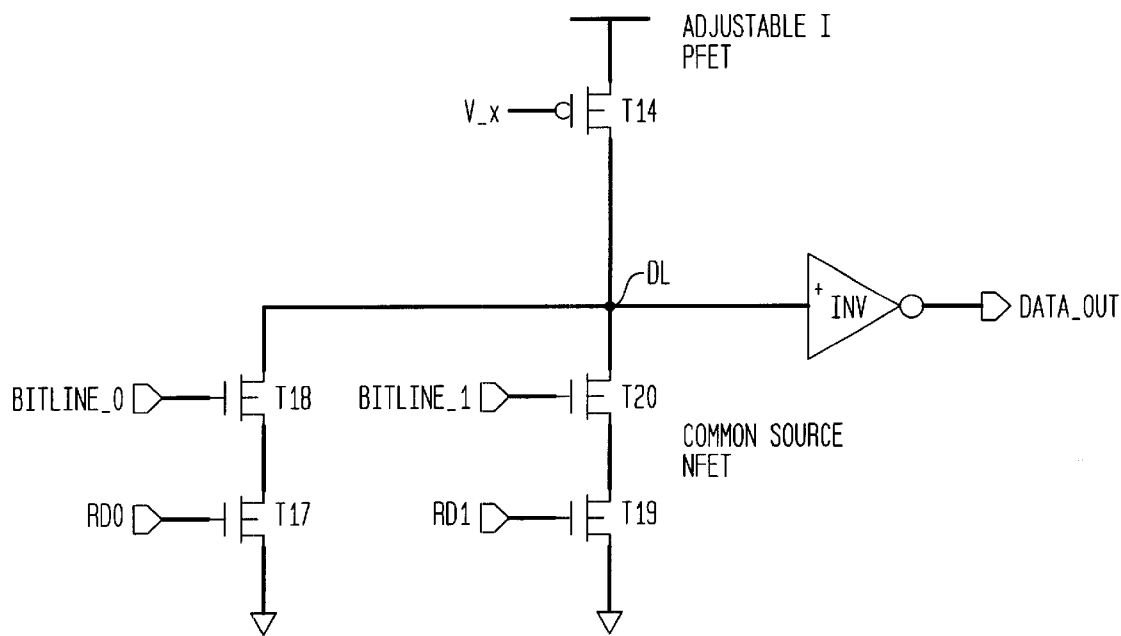
FIG. 1 illustrates a basic embodiment of a stabilized direct sense (SDS) amplifier circuit pursuant to the present invention. The circuit does not have gain and has a simple inverter output, and provides compensation for PVT variations.
Figure 2:
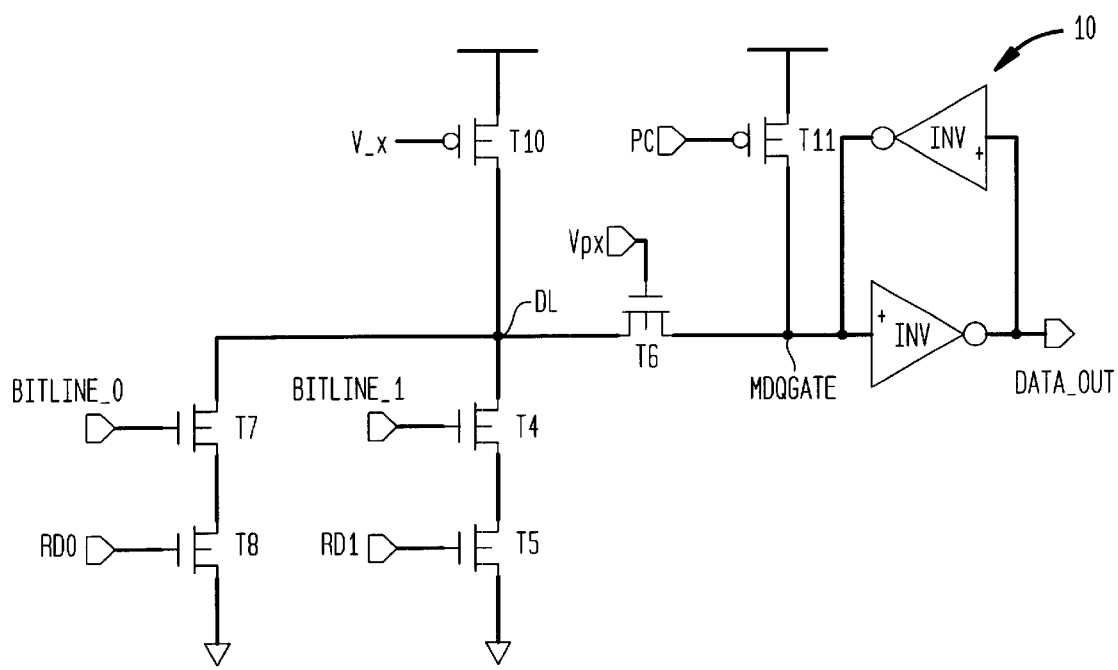
FIG. 2 illustrates a second embodiment of a stabilized direct sensing (SDS) amplifier circuit with gain and a dual inverter output latch circuit

FIG. 1 and 2 illustrate quantizing circuits which receive an input signal and quantize it into logic levels. The direct sense amplifier circuits shown in FIGS. 1 and 2 are exemplary of other alternative embodiments of quantizing circuits which quantize an input signal into logic level output signals.

Figure 3:
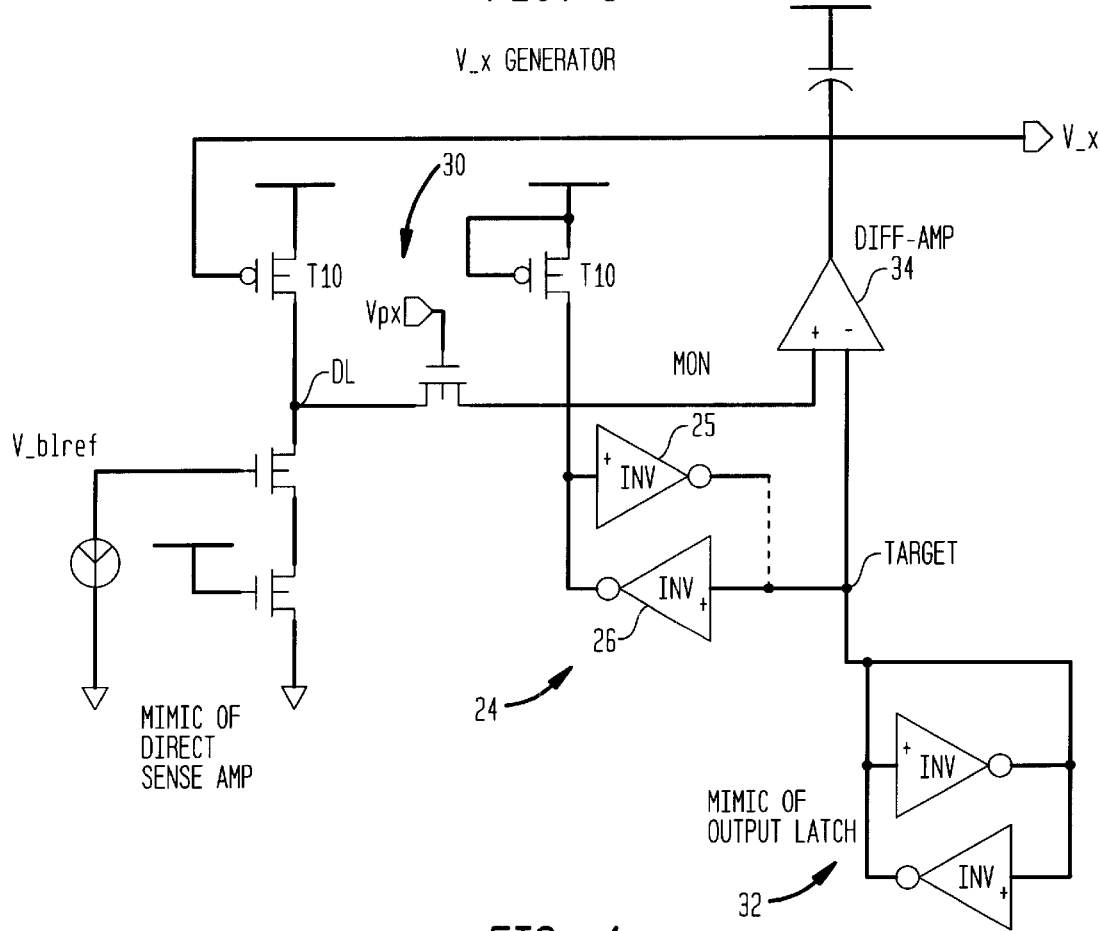
FIG. 3 is a stabilization bias generator circuit which outputs a compensated reference voltage V__x. The compensated reference voltage V__x is an input to the circuit of FIG. 2, and is used to stabilize the switch point of the stabilized direct sensing (SDS) amplifier circuit of FIG. 2.

FIG. 1 illustrates a basic embodiment of a stabilized direct sense (SDS) amplifier circuit which does not have any gain and which has a simple inverter output This circuit, in combination with a mimic bias generator circuit similar to that of FIG. 3, provides a solution to the problems caused by PVT variations. In this embodiment, the output latch is a simple inverter INV, and a controlled current source PFET transistor T14 is used to inject current into or draw current out of a DL node. The amount of current supplied from the current source is controlled by a V__x reference input, which is provided by a mimic bias generator circuit similar to that of FIG. 3.

Referring to FIG. 1, bitline inputs at Bitline__0 and Bitline__1 are connected respectively to an NFET device T18, T20. An additional series NFET device T17, T19 is used to select either the even or the odd bitline for sensing.

The circuit of FIG. 1 provides a single-ended sense amplifier wherein the amplifier is essentially a common source NFET configuration T18 or T20) with an adjustable current source load provided by a PFET T14. The PFET current source is automatically adjusted to place the NFET amplifier T18 or T20 in an operating range to provide maximum amplification of a small signal superimposed on a bitline precharge voltage. A mimic bias generator circuit similar to that of FIG. 3 provides this operating point adjustment, and provides a direct, singleended sensing operation while using a small number of transistors.

FIG. 2 illustrates a preferred embodiment of a stabilized direct sense (SDS) amplifier circuit with gain and a dual inverter output latch circuit 10, which also compensates for PVT variations.

FIG. 3 is a mimic stabilization bias generator circuit which outputs a compensated reference voltage V_x which is an input to the gate of controlled current source transistor T10 of FIG. 2. This reference voltage is used to stabilize the switch point of the stabilized direct sensing (SDS) amplifier circuit of FIG. 2.

Referring to FIG. 2, a PFET current supply device T10 with its gate at input V_x, the reference input from the mimic bias generator circuit of FIG. 3, is used to gate current into node DL. A series NFET T6 with VPX, a DC voltage higher than VDD, connects the first node DL to a second node MDQGATE and to an output inverter latch circuit 10 comprising output to input connected inverters INV_1, INV_2.

The relative strengths of the 2 inverters of the output latch circuit are sized with a weak feedback inverter. The switchpoint of a latch with a weak feedback inverter behaves more like a single inverter, and its switchpoint is more accurately predicted by an output latch mimic circuit as in FIG. 3. A restore FET T11 is used to initialize the output latch 10.

The SDS circuit of FIG. 2 provides amplification of the data signal on the node DL by resistively coupling the node DL to the node MDQGATE. When the node DL level drops in response to a 1 data bitline signal, the latch formed by INV_1 and INV_2 amplifies the MDQGATE level without full loading effects of node DL. This gain circuit, or an equivalent gain circuit, must be accurately represented in the mimic circuit of FIG. 3 to provide an accurate V_x voltage.

Figure 6:
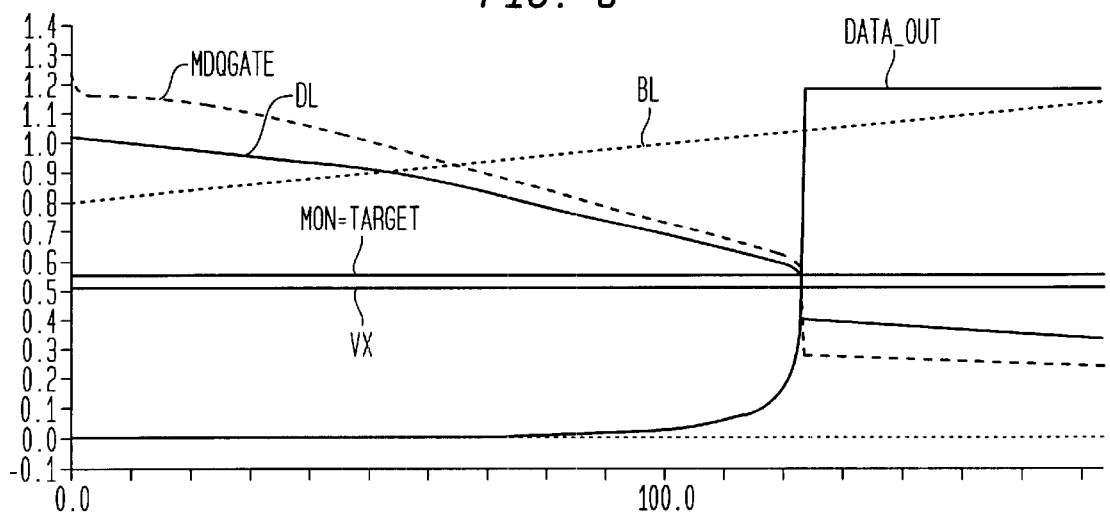
FIG. 6 illustrates how gain or amplification is realized by resistive coupling of an output latch circuit to the DL node.

The SDS circuit of FIG. 2 and the bias circuit of FIG. 3 provide a tracking circuit which provides a DC gain through the senseamp to provide an amplified signal at the MDQGATE node. The gain is achieved by the resistive isolation formed by the NFET T6 with VPX on its gate. A tracking circuit can be designed to track either the DL node or the amplified MDQGATE node. FIG. 6 shows a gain of approximately 2× between the DL node and the MDQGATE node, and this gain is reflected in the V_x bias level.

The gain or amplification is achieved by resistive coupling of the output latch 10 to the DL node. The graph of FIG. 6 explains this visually.

FIG. 6 shows the internal voltage of the mimic stabilization circuit and the senseamp node MDQGATE in response to a sweeping bitline voltage between 0.8 volts and 1.2 volts. This invention makes the output inverter/latch switch at a bitline voltage of Vdd−Vdd/8, or other bitline voltage levels, independent of PV and T. The second graph in FIG. 6 shows the MDQGATE voltage versus BL voltage as a function of temperature, and it demonstrates a consistent switch point of Vdd−Vdd/8. The senseamp and its AC response are now stabilized against temperature variations.

The stabilization bias generator circuit of FIG. 3 mimics the circuit of FIG. 2, and has a similar senseamp circuit 30 and a similar output inverter/latch circuit 32 to function as a mimic circuit of the SDS circuit of FIG. 2. The stabilization circuit also contains a differential amplifier Diff-Amp 34 of stand design. The output of the Diff-Amp 34 generates the voltage V_x, used as an input to the circuit of FIG. 2 to control transistor T10 and the current flow into the DL node. The MON (monitor) node is the positive input to the Diff-Amp 34, and a reference switch point voltage generated by the mimic circuit 32 of the output inverter/latch circuit forms the negative input to the Diff-Amp 34.

The V_blref input from a Voltage Source V0 on the left side of FIG. 3 is a fixed DC voltage which denotes the halfway point, or trip point, between a '1' and '0' bitline level.

Figure 4:
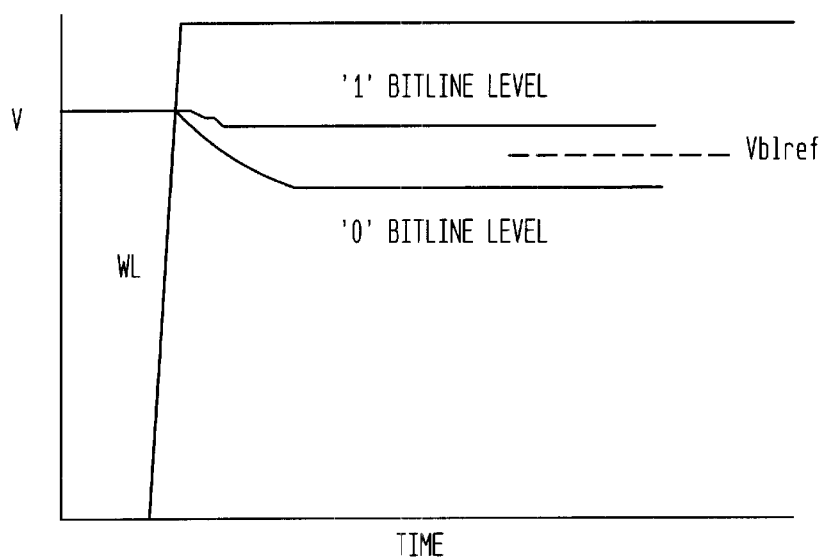
FIG. 4 illustrates a plot of the 1 and 0 Bitline levels with time, and illustrates the V__blref voltage level halfway between the 1 and 0 Bitline levels.

FIG. 4 illustrates a plot of the 1 and 0 Bitline levels with time, and illustrates that the V_blref voltage level is halfway between the lowest 1 and the highest 0 Bitline levels anticipated in the circuit design.

In the design of a DRAM memory with short bitlines and high cell capacitance, such as can be designed in trench storage technology, the cell to bitline transfer ratio may be 50%. Then for a Vdd of 1.2 volts, a reasonable trip point can be Vdd−150 mv, which can be stated as Vdd−Vdd/8.

In FIG. 3, a mimic output inverter latch 24 is comprised of inverters 25 and 26 and is connected to the MON node to simulate the loading of the output inverter latch in the SDS circuit of FIG. 2. In FIG. 3, the output of inverter 25 is disconnected from the Target node to prevent a potential alteration of the Target voltage, but may be connected to the Target node in other embodiments. The MON node provides a reference voltage which the bias circuit uses to adjust the V_x voltage level to match the bitline switch point to the output inverter/latch trip point voltage.

In other words, the Diff-Amp 34 monitors the voltage at the MON node in the mimic senseamp circuit 30, and compares it to the desired target level generated by the mimic output latch circuit 32. The Diff-Amp 34 outputs the V_x voltage level which will make the voltage at the MON node equal to the target level voltage output of the mimic circuit 32 when the Vblref voltage is halfway between a 1 and a 0 level. The MON node is loaded by a mimic of the output inverter/latch biased at the Target voltage level.

Figure 5:
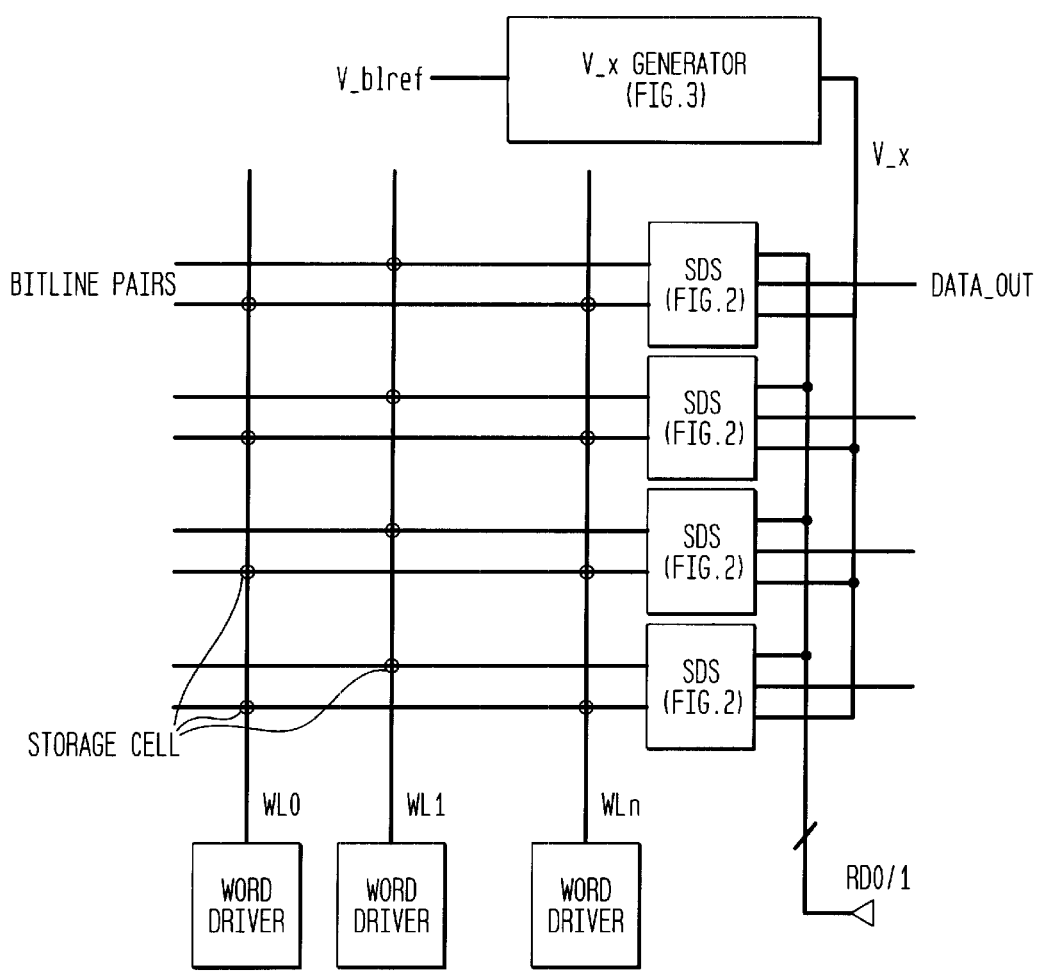
FIG. 5 illustrates a V__x generator circuit as illustrated in FIG. 2 responding to a V__blref input signal and generating a V__x output signal which is applied as a control input to each SDS senseamp in a DRAM array.

Once this reference level V_x is generated by the circuit of FIG. 3, it can be distributed to hundreds of SDS senseamps in a DRAM array to match the bitline trip point to the trip point of the output inverter/latch, as indicated in FIG. 5. In this configuration a control voltage is generated for each condition of PVT, to guarantee the bitline switch point of Vdd−Vdd/8, for example, is matched with the switch point voltage of the output switching means of typically around Vdd/2. It is necessary to closely match the geometric layout of the mimic circuits to that of the SDS senseamps to achieve good tracking.

FIG. 5 illustrates a DRAM memory array wherein a V_x generator circuit, similar to that illustrated in FIG. 3, responds to a V_blref input signal and generates a V_x output signal which is applied as a control input to each of a memory array of SDS senseamps, similar to that illustrated in FIG. 2, which is connected to a Bitline pair in the DRAM array with Word Drivers WL0 . . . WLn.

Two embodiments of an SDS amplifier circuit are disclosed, FIG. 1 with no gain, and FIG. 2 with additional gain. The V_x generator mimic circuit needs to be constructed with the same implementation as the SDS circuits in the DRAM array to achieve proper tracking.

In an alternate embodiment, the output latch of FIG. 2 can be replaced by a simple inverter, similar to the circuit of FIG. 1, and a controlled current source can be used to inject into or draw current out from MDQGATE node. Gain is realized at the MDQGATE node from the resistive isolation between the DL and MDQGATE nodes. The amount of current supplied from the current sources is controlled by the V_x (or V_y) reference generator, which has the mimic circuits of FIG. 2 modified to include whichever gain configuration is used in the SDS senseamps. These current sources can be cut off with the RD_sel signal when the SDS senseamp is not performing a read function.

Another embodiment can replace the current supply devices, which are presently PFETs with gates controlled by V_x, with NFETS with gates controlled by V_y, to perform the dual functions of the V_x controlled devices. It is well known in the art how to convert a PFET reference level (V_x) into an NFET reference level (V_y) by the use of a 1:1 current mirror.

The present invention as embodied in the circuits of FIGS. 1 and 2 provides a singleended sense amplifier structure wherein the amplifier is essentially a common source NFET configuration with an adjustable current source load provided by a PFET. The PFET current source is automatically adjusted to place the NFET amplifier in the operating range to provide maximum amplification of a small signal superimposed on a bitline precharge voltage. A mimic bias generator circuit provides this operating point adjustment, and provides a direct, single-ended sensing operation while using a small number of transistors.

The circuits of of the present invention solve the problem of a single-ended high-gain scheme, i.e. that of rejecting a DC voltage, and stabilizing the operating point in response to PVT changes. To save silicon area, the compensation circuitry is shared by many SDS amplifiers. This has the advantage of reducing the area, but will not compensate for local fluctuations. Prior art stabilized amplifier circuits teach feedback techniques which are individual to each amplifier, rather than a distributed feedback technique as in the present invention. Other forms of operating point compensation can include adjusting the precharge, or DC voltage instead of the amplifier load current using alternate circuits for the mimic, and circuits to modulate the conduction through the bit line sense device.

Multiple mimic circuits can be used to compensate for parametric variations across a silicon chip due to the physical separation of different areas of the chip, to provide for improved cross-chip tracking.

Process cases covering +/−0.75 sigma, +/−3 sigma NFET and PFET beta, (both together, and in opposite directions), VT mismatching, and temperature variations ranging from −10 C. and 105 C. with voltage ranging from 0.9 v to 1.3 volts were tried on the stabilized direct sensing memory architecture of the present invention The results showed all cases passing, and resulted in a greatly extended operating range and processing range over uncompensated direct sensing schemes.

While several embodiments and variations of the present invention for a stabilized direct sensing memory architecture are described in detail herein, it should be apparent that the disclosure and teachings of the present invention will suggest many alternative designs to those skilled in the art.

Having thus described our invention, what we claim as new, and desire to secure by Letters Patent is:

1. A current-compensated, direct sense amplifier circuit for converting a single-ended, small-swing, input analog signal to output standard logic levels comprising a transistor having an input gate receiving the single-ended input signal, a compensated current source coupled to the transistor, and an output device having an input coupled to the transistor.

2. The circuit of claim 1, for converting the single-ended, small-swing, input analog voltage signal to output standard logic levels of Vdd and Gnd, comprising an FET having an input gate receiving the single-ended input signal, a compensated current source coupled to the drain of the FET, and an output device having an input coupled to the drain of the FET.

3. The circuit of claim 2, wherein the FET comprises a common source connected NFET with its drain connected to the current source which comprises a PPET with its gate coupled to a control voltage.

4. The circuit of claim 3, wherein a plurality of sense amplifier circuits share a common control voltage generator for generating the control voltage.

5. The circuit of claim 2, including a plurality of common source NFETs, each having single ended inputs connected to a multiplex selection NFET, each with an individual selection signal for sensing one of the single ended inputs.

6. The circuit of claim 1, further comprising a control voltage generator for generating the control voltage to control the current source to bias the output device near its trip point when the single-ended input signal is halfway between analog '1' and '0' voltage levels.

7. The circuit of claim 6, wherein the control voltage generator comprises a differential amplifier having a negative input coupled to an output device trip point reference, and a positive input coupled to a mimic circuit of the sense amplifier circuit which comprises substantially the same components as the sense amplifier circuit.

8. The circuit of claim 7, wherein the mimic circuit has a gated current supply controlled by the output of the differential amplifier, and its singe-ended input connected to a DC voltage halfway between the '1' and '0' voltage levels.

9. The circuit of claim 6, wherein in the control voltage generator, the output device trip point reference comprises an inverter with its input connected to its output.

10. The circuit of claim 6, wherein in the control voltage generator, the output device trip point reference comprises a pair of cross coupled inverters having each inverter input connected to the other inverter output.

11. The circuit of claim 1, wherein the output device comprises an inverter.

12. The circuit of claim 1, wherein the output device comprises a pair of cross-coupled inverters which are resistively coupled to a drain of the transistor to amplify the signal on the drain.

13. A stabilized direct sensing memory architecture which provides Process, Voltage and Temperature (PVT) compensation to a direct sensing circuit, comprising:
a stabilized direct sense (SDS) circuit comprising, a current supply transistor with a gate at a control voltage for gating current into a first node, an input transistor for connecting an input signal to the first node, and to an output device;
a stabilization bias generator circuit for generating the control voltage and comprising a stabilized direct sense circuit functioning as a mimic circuit of the SDS circuit and having a current supply transistor, an input transistor and an output device similar to the SDS circuit.

14. The circuit of claim 13, wherein the base generator circuit comprises a differential amplifier for generating the control voltage for the current supply transistor to control the current flow into the first node, a second node of the mimic circuit is a first input to the differential amplifier, and a reference switch point voltage generated by a mimic circuit of the output device forms a second input to the differential amplifier.

15. The stabilized direct sensing memory architecture of claim 13, wherein the bias generator circuit comprises a series connected transistor connecting a first node to a second node which is the first input to the differential amplifier, and a reference switch point voltage generated by a mimic circuit of the output device forms a second input to the differential amplifier, wherein the input transistor receives an input from a voltage source which is a DC voltage at a halfway switch point voltage between a '1' and '0' bitline level.

16. The stabilized direct sensing memory architect of claim 13, wherein in the bias generator circuit the output device comprises an inverter circuit which has its input connected to its output, which results in the generation of a voltage very close to its AC switch point, to provide a reference voltage which adjusts the control voltage to match a bitline switch point voltage to the switch point voltage of the output device.

17. The stabilized direct sensing memory architecture of claim 13, in combination with a memory array wherein the bias generator circuit is common to and shared by a plurality of SDS circuits in the memory array, and the control voltage is distributed to the plurality of SDS circuits in the memory array to match the memory array bitline switch point voltage to the switch point voltage of the output device of each SDS circuit.

18. The stabilized direct sensing memory architecture of claim 13, wherein the SDS circuit comprises a current supply PFET with its gate controlled by the control voltage.

19. The stabilized direct sensing memory architecture of claim 13, wherein the SDS circuit comprises a current supply NFET with its gate controlled by the control voltage.

20. The stabilized direct sensing memory architecture of claim 13, wherein the SDS circuit comprises a single-ended sense amplifier having a common source NFET configuration with an adjustable current source load provided by a PFET, which is adjusted to place the sense amplifier in an operating range to provide maximum amplification of a small signal superimposed on a bitline precharge voltage.

21. A method of compensating for variable operating conditions while quantizing the level of a small-swing, input analog signal into logic signal levels, comprising:

varying a supply of current to a quantizing circuit using a variable current supply device having a control signal input thereto;

generating said control signal using a mimic circuit of said quantizing circuit which includes one or more devices which are representative of devices included in said quantizing circuit;

whereby said varying said supply of current reduces undesired changes in a switch point of said quantizing circuit resulting from changes in said variable operating conditions.

22. The method of claim 21, wherein said generating generates said control signal based on an input representing a switch point device of said mimic circuit and on an input representing other devices in said quantizing circuit.

23. The method of claim 21, wherein the step of varying varies current through a current source transistor to a quantizing circuit transistor having an input gate receiving the input analog signal, and the quantizing circuit transistor switches an output device coupled to the quantizing circuit transistor.

24. The method of claim 21, wherein the control signal controls a current source in the quantizing circuit to bias an output device in the quantizing circuit near its trip point when the input analog signal is halfway between analog '1' and '0' voltage levels.

25. The method of claim 21, in a memory array, including distributing the control signal generated by the mimic circuit to a plurality of quantizing circuits in the memory array.

26. The method of claim 21, wherein the quantizing circuit is a direct sense circuit in a memory array, including varying the supply of current through a current source transistor and quantizing the input analog signal through a quantizing input transistor, and switching an output device by the quantizing input transistor.

27. The method of claim 26, wherein the mimic circuit generates said control signal by varying the supply of current through a current source transistor and quantizing the input analog signal through a quantizing input transistor, and switching an output device by the quantizing input transistor.

28. A method of compensating for variable operating conditions while performing direct sensing operations, comprising:

varying a supply of current to a direct sensing circuit using a variable current supply device having a control signal input thereto; and generating said control signal using a mimic circuit of said direct sensing circuit which includes one or more devices which are representative of devices included in said direct sensing circuit, whereby said varying said supply of current reduces undesired changes in a switch point of said direct sensing circuit resulting from changes in said variable operating conditions.

29. The method of claim 28, wherein said generating generates said control signal based on an input representing a switch point device of said mimic circuit and on an input representing other devices in said direct sensing circuit.

30. The method of claim 28, wherein the step of varying varies current through a current source transistor to a direct sensing circuit transistor having an input gate receiving an input analog signal, and the direct sensing circuit transistor switches an output device coupled to the direct sensing circuit transistor.

31. The method of claim 28, wherein the control signal controls a current source in the direct sensing circuit to bias an output device in the direct sensing circuit near its trip point when an input analog signal is halfway between analog '1' and '0' voltage levels.

32. The method of claim 28, in a memory array, including distributing the control signal generated by the mimic circuit to a plurality of direct sensing circuits in the memory array.

33. The method of claim 28, wherein the direct sensing circuit is in a memory array, and including varying the supply of current through a current source transistor and sensing an input analog signal through a sensing input transistor, and switching an output device by the sensing input transistor.

34. The method of claim 33, wherein the mimic circuit generates said control signal by varying the supply of current through a current source transistor and sensing an input analog signal through a sensing input transistor, and switching an output device by the sensing input transistor.

* * * * *